United States Patent [19]

Shibahata

[11] Patent Number: 5,058,700
[45] Date of Patent: Oct. 22, 1991

[54] DRIVE FORCE DISTRIBUTION CONTROL SYSTEM FOR MOTOR VEHICLE

[75] Inventor: Yasuji Shibahata, Tochigi, Japan

[73] Assignee: Honda Giken Kogyo Kabushiki Kaisha, Tokyo, Japan

[21] Appl. No.: 337,809

[22] Filed: Apr. 14, 1989

[30] Foreign Application Priority Data

Apr. 15, 1988 [JP] Japan .................................. 63-51053

[51] Int. Cl.⁵ .......................................... B60K 17/354
[52] U.S. Cl. .................................... 180/245; 180/249; 180/233; 364/424.05
[58] Field of Search ........... 364/424.05, 424.1, 426.02, 364/426.03; 180/248, 249, 247, 233, 140, 142, 245, 251, 197

[56] References Cited

U.S. PATENT DOCUMENTS

| 4,681,180 | 7/1987 | Oyama et al. | 180/248 |
| 4,705,130 | 11/1987 | Fukunaga et al. | 180/142 |
| 4,754,834 | 7/1988 | Ozaki et al. | 180/247 |
| 4,754,835 | 7/1988 | Stelter et al. | 180/248 |
| 4,768,602 | 9/1988 | Inoue et al. | 180/233 |
| 4,773,012 | 9/1988 | Ito et al. | 180/142 |

FOREIGN PATENT DOCUMENTS

| 0198522 | 9/1987 | Japan | 180/233 |
| 0265030 | 11/1987 | Japan | 180/249 |
| 0013824 | 1/1988 | Japan | 180/149 |

Primary Examiner—Charles A. Marmor
Assistant Examiner—Anne Marie Boehler
Attorney, Agent, or Firm—Armstrong, Nikaido, Marmelstein, Kubovcik & Murray

[57] ABSTRACT

A drive force distribution control system for a motor vehicle controls a drive force distribution ratio between drive road wheels based on a steering torque and a lateral acceleration. The drive force distribution control system includes a drive force distribution mechanism for varying the distribution ratio between drive forces to be applied to the drive road wheels, a steering force sensor for detecting the magnitude and direction of the steering force applied to steer the motor vehicle, a lateral acceleration sensor for detecting the lateral acceleration applied to the motor vehicle, a control unit for determining a target distribution ratio between drive forces to be applied to the drive road wheels based on the steering force detected by the steering force sensor and the lateral acceleration detected by the lateral acceleration sensor, and a drive mechanism for actuating the drive force distribution mechanism so that the drive force distribution ratio between the drive forces to be applied to the drive road wheels will be equalized to the target distribution ratio determined by the control unit.

10 Claims, 6 Drawing Sheets

DRIVE FORCE DISTRIBUTION CONTROL SYSTEM FOR MOTOR VEHICLE

BACKGROUND OF THE INVENTION

1. Field of the Invention

The present invention relates to a drive force distribution control system for use with a motor vehicle, and more particularly to a drive force distribution control system for controlling a ratio between drive forces to be distributed to a pair of laterally spaced drive road wheels of a motor vehicle.

2. Description of the Relevant Art

Motor vehicles include power transmission mechanisms for transmitting power from a drive source to a pair of laterally spaced drive road wheels to produce drive forces. Such a power transmission mechanism includes a differential for driving the drive road wheels on respective outer and inner turning circles at respective speeds dependent on the radii of these outer and inner turning circles while the motor vehicle is making a turn. Conventional differentials are arranged to distribute equal amounts of power from the drive source to the drive road wheels. Therefore, if one of the road wheels sticks in a muddy pit or the like in a road, it is idly rotated, and the amount of power transmitted to the other road wheel is reduced so that effective drive forces cannot be produced. To avoid this difficulty, there have recently been proposed various differentials which can limit the differential function to maintain predetermined minimum drive forces available for propelling the motor vehicle. Differentials with the ability to limit the differential function, often called limited-slip differentials, include a torque-proportional differential for limiting the differential function dependent on a torque acting between a pair of pinions, and a preloaded differential utilizing the resiliency of a spring.

The above conventional differentials mechanically limit the differential function. When the motor vehicle makes a turn, the drive force produced by the drive road wheel on the inner turning circle is increased owing to the difference between the rotational speeds of the drive road wheels on the inner and outer turning circles. The increased drive force then generates a moment in a direction to prevent the turning of the motor vehicle, and hence the turning performance of the motor vehicle is lowered.

SUMMARY OF THE INVENTION

It is an object of the present invention to provide a drive force distribution control system for controlling drive forces to be distributed to a pair of laterally spaced drive road wheels of a motor vehicle at an optimum distribution ratio according to turning conditions of the motor vehicle for increased turning performance of the motor vehicle.

According to the present invention, there is provided a drive force distribution control system for a motor vehicle having a pair of drive road wheels, comprising: a drive force distribution mechanism for varying a distribution ratio between drive forces to be applied to the drive road wheels; steering force detecting means for detecting the magnitude and direction of a steering force applied to steer the motor vehicle; lateral acceleration detecting means for detecting a lateral acceleration applied to the motor vehicle; distribution ratio determining means for determining a target distribution ratio between drive forces to be applied to the drive road wheels based on the steering force detected by the steering force detecting means and the lateral acceleration detected by the lateral acceleration detecting means; and drive means for actuating the drive force distribution mechanism so that the drive force distribution ratio between the drive forces to be applied to the drive road wheels will be equalized to the target distribution ratio determined by the distribution ratio determining means.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

A drive force distribution control system for use in a motor vehicle according to a first embodiment of the present invention will hereinafter be described with reference to FIGS. 1 through 3.

Figure 1:
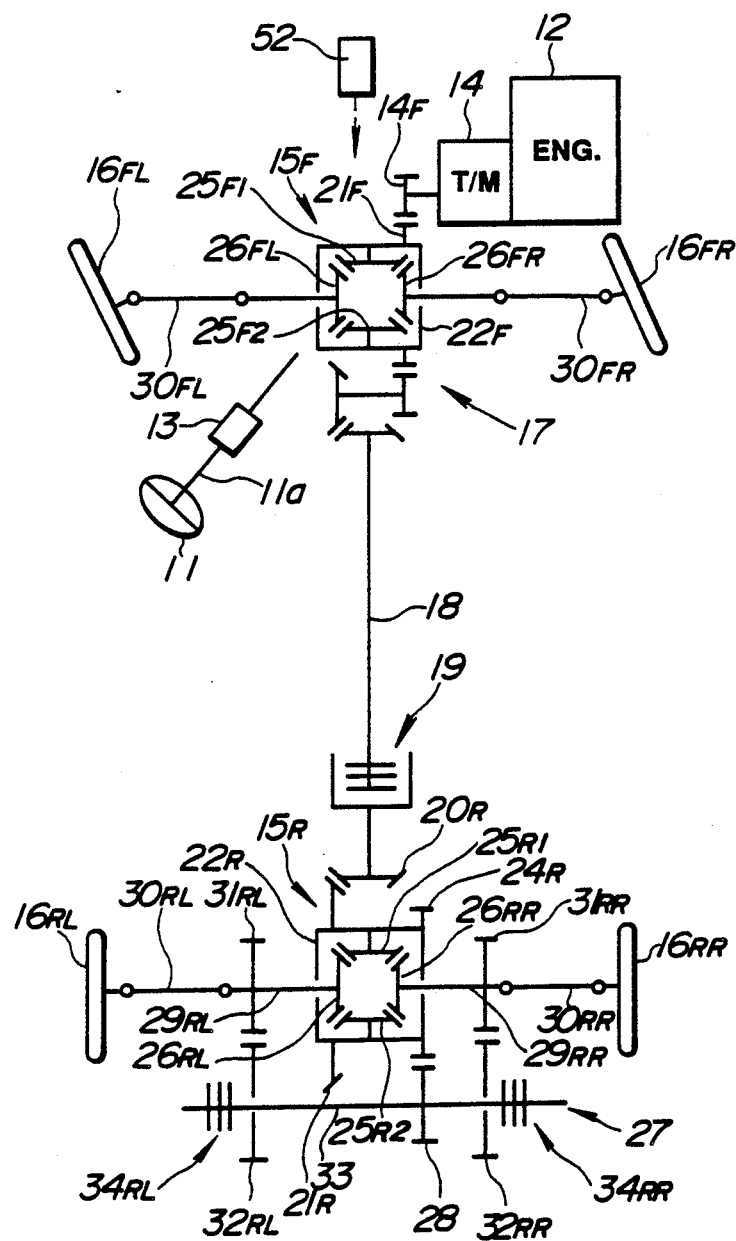
FIG. 1 is a schematic plan view of a power transmission mechanism of a drive force distribution control system according to a first embodiment of the present invention.

As shown in FIG. 1, a steering shaft 11a coupled to a steering wheel 11 is associated with a torque sensor 13 for detecting the magnitude and direction of a steering force applied to the steering wheel 11. A lateral acceleration sensor 52 is disposed somewhere in the motor vehicle for detecting an acceleration applied laterally to the motor vehicle. The steering torque sensor 13 and the lateral acceleration sensor 52 are electrically connected to a control circuit 51 shown in FIG. 2. An engine 12 is combined with a transmission 14 such that the power produced by the engine 12 will be transmitted through the transmission 14 to a front differential 15F.

The front differential 15F comprises a differential case 22F rotatably mounted on the vehicle body, and a pair of side gears 26FR, 26FL and a pair of pinions 25F1, 25F2 meshing with the side gears 26FR, 26FL, the pinions 25f1, 25F2 and the gears 26FR, 26FL being disposed in the differential case 22F. The side gears 26FR, 26FL are coupled respectively to a pair of laterally spaced front road wheels 16FL, 16FR through front axles 30FR, 30FL, respectively.

A power transmitting gear 21F is fixedly mounted on and around the differential case 22F and held in mesh with a gear 14F mounted on the output shaft of the transmission 14 and also with a gear train 17 which serves to change directions in which the power is transmitted. The power of the engine 12 is differentially transmitted to the front road wheels 16FL, 16FR by the front differential 15F, and also transmitted to a propeller shaft 18 through the gear train 17.

A hydraulically operated transfer clutch 19 is mounted on the propeller shaft 18 for transmitting a torque dependent on a hydraulic pressure supplied from a hydraulic pressure circuit 35 (described later on). A drive gear 20R is fixed to the rear end of the propeller shaft 18 and meshes with a driven gear 21R of a rear differential 15R. Therefore, the power of the engine 12 is transmitted through the propeller shaft 18 and the transfer clutch 19 to the rear differential 15R.

The rear differential 15R has a differential case 22R on and around which the driven gear 21R and a drive gear 24R are fixedly mounted. The drive gear 24R is held in mesh with a driven gear 28 of a transmission mechanism 27. The rear differential 15R also has a pair of pinions 25R1, 25R2 and a pair of side gears 26RL, 26RR meshing with the pinions 25R1, 25R2, the pinions 25R1, 25R2 and the side gears 26RL, 26RR being rotatably supported in the differential case 22R. The side gears 26RL, 26RR are coupled respectively to output shafts 29RL, 29RR which are connected to a pair of laterally spaced rear road wheels 16RL, 16RR through rear axles 30RL, 30RR, respectively.

The transmission mechanism 27 has a countershaft 33 rotatably disposed parallel to the output shafts 29RL, 29RR, and transmission gears 32RL, 32RR rotatably supported on the countershaft 33 and meshing respectively with transmission gears 31RL, 31RR fixed to the output shafts 29RL, 29RR, respectively. Between the countershaft 33 and the transmission gears 32RL, 32RR, there are interposed hydraulic clutches 34RL, 34RR, respectively, which are coupled the hydraulic pressure circuit 35 for transmitting torques dependent upon the pressure of working oil supplied from the hydraulic pressure circuit 35.

Figure 2:
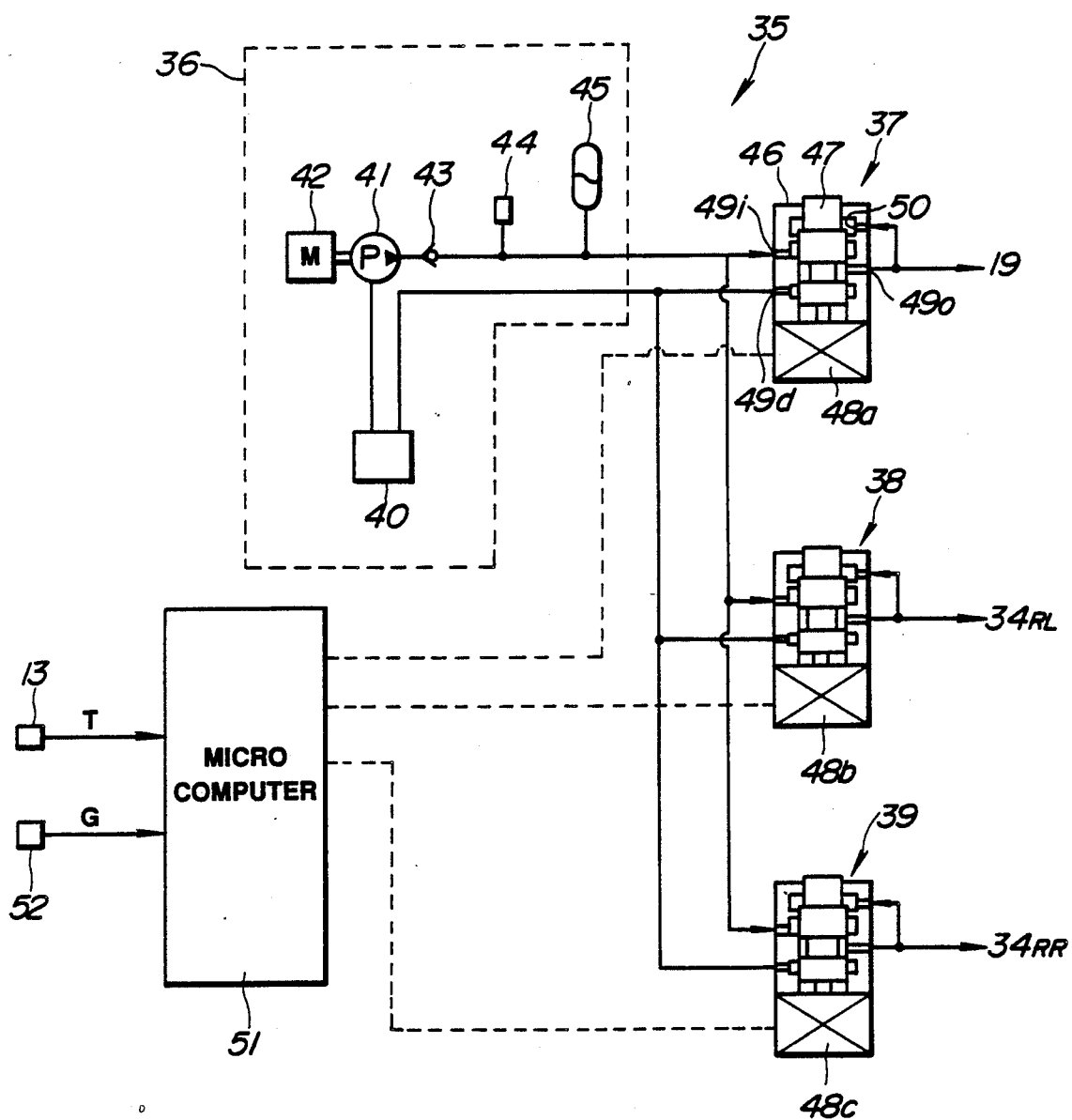
FIG. 2 is a block diagram of the control system.

As shown in FIG. 2, the hydraulic pressure circuit 35 comprises a hydraulic pressure source 36, and three solenoid-operated control valves 37, 38, 39 connected in parallel to the hydraulic pressure source 36. The solenoid-operated control valves 37, 38, 39 are connected to the transfer clutch 19 and the clutches 34RL, 34RR, respectively. The hydraulic pressure source 36 comprises a tank 40 for storing working oil, a pump 41 for discharging the working oil under pressure from the tank 40, a motor 42 for actuating the pump 41, a check valve 43 for preventing the working oil from flowing back to the tank 40, a hydraulic pressure switch 44 for detecting the pressure under which the working oil is discharged from the pump 41, and an accumulator 45 for storing the hydraulic pressure. The hydraulic pressure source 36 thus supplies working oil under a predetermined pressure to the solenoid-operated control valves 37, 38, 39.

Each of the solenoid-operated control valves 37, 38, 39 comprises a casing 46 having an inlet port 49i, an outlet port 49o, and a drain port 49d, a spool 47 slidably disposed in the casing 46, and a solenoid 48 (which may be 48a, 48b, or 48c) for axially moving the spool 47. The inlet port 49i is connected to the pump 41, the drain port 49d to the tank 40, and the outlet port 49o to a corresponding one of the clutches 19, 34RL, 34RR. The solenoids 48a, 48b, 48c are electrically connected to the control circuit 51. In response to energization of the solenoid 48, the spool 47 is axially displaced to vary the cross-sectional area of a passage between the inlet port 49i and the outlet port 49o to regulate the pressure of working oil discharged from the outlet port 49o. The casing 46 has a back pressure chamber 50 defined therein which is supplied with the hydraulic pressure from the outlet port 49o to apply a pressing force to the spool 47 in a direction against the pressing force from the solenoid 48. When the solenoid 48 is de-energized, the spool 47 is axially moved under the pressing force in the back pressure chamber 50 to bring the outlet port 49o and the drain port 49d into communication with each other, thus allowing the working oil from the outlet port 49o to return to the tank 40.

The solenoid-operated control valves 37, 38, 39 therefore supplies hydraulic pressures dependent on electric currents applied to the respective solenoids 48a, 48b, 48c, from the outlet ports 49o to the clutches 19, 34RL, 34RR.

The control circuit 51 comprises a microcomputer and other circuits for determining a drive force distribution ratio between the rear road wheels 16RL, 16RR and a drive force distribution ratio of the rear road wheels 16RL, 16RR to the front road wheels 16FL, 16FR based on a steering force T detected by the steering torque sensor 13 and a lateral acceleration G detected by the lateral acceleration sensor 52, and supplying electric currents dependent on the determined drive force distribution ratios to the solenoids 48a, 48b, 48c of the solenoid-operated control valves 37, 38, 39.

Operation of the drive force distribution control system thus constructed will be described below with reference to the flowchart of FIG. 3.

Figure 3:
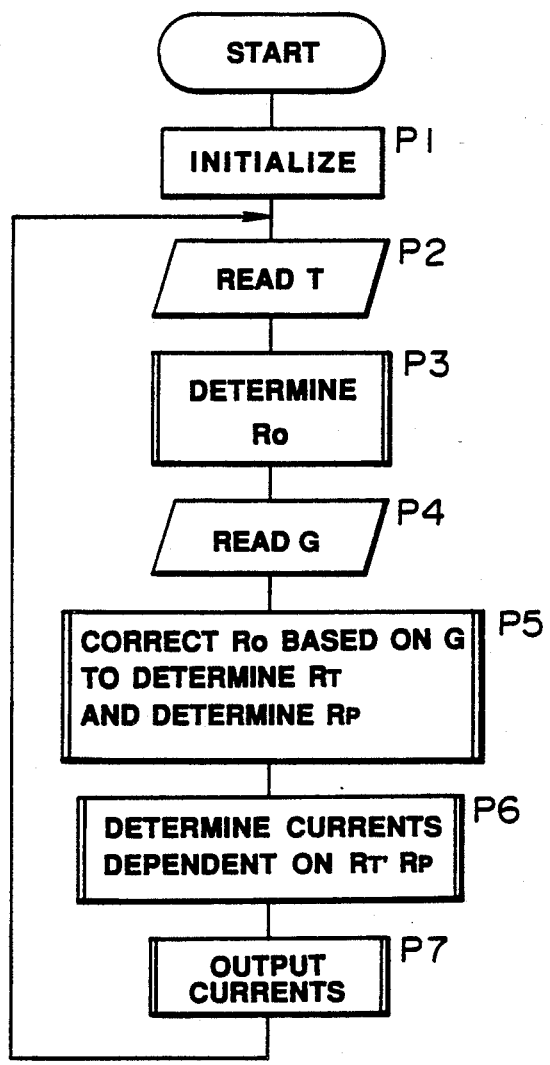
FIG. 3 is a flowchart of a control sequence of the control system.

The microcomputer of the control circuit 51 repeatedly executes the control sequence shown in FIG. 3 to actuate the clutches 19, 34RL, 34RR for controlling the drive force distribution to and between the rear road wheels 16RL, 16RR.

When an ignition key is operated to turn on a key switch, the microcomputer and other circuits are energized to start the control sequence. The microcomputer is first initialized by erasing stored data from a register therein and addressing the register in a step P1.

In a next step P2, the magnitude and direction of a steering force or torque T is read from an output signal from the torque sensor 13. A step P3 then determines, according to a separately defined subroutine, a reference rear wheel drive force distribution ratio Ro at which drive forces are to be applied to the rear road wheels 16RL, 16RR, i.e., a reference value for a ratio $D_L/D_R$ between a drive force $D_L$ to be applied to the rear wheel 16RL and a drive force $D_R$ to be applied to the rear wheel 16RR. In the step P3, the reference distribution ratio Ro is determined from a predetermined data table by addressing the data table with the steering force T. The reference distribution ratio Ro has such a characteristic with respect to the steering force T that it varies at a certain ratio when the steering force T varies.

Figure 7:
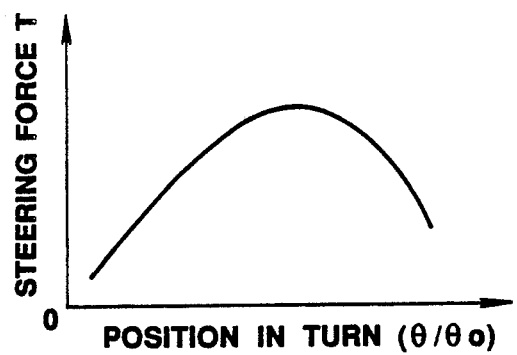
FIG. 7 is a graph showing steering force characteristics.

When the motor vehicle makes a turn, the steering force T varies dependent on the position of the motor vehicle in its turn, i.e., a ratio ($\theta/\theta o$) of an angle $\theta$ through which the motor vehicle has already turned to an entire angle $\theta o$ through which the motor vehicle is supposed to turn during the turn, as shown in FIG. 7. As can be understood from FIG. 7, the steering force T is substantially proportional to the position of the motor vehicle in the turn during an initial phase of the turn. Therefore, the reference distribution ratio Ro also varies dependent on the position of the motor vehicle in the turn during the initial phase of the turn.

Then, a lateral acceleration G on the motor vehicle is read in based on an output signal from the lateral acceleration sensor 52 in a step P4. A step P5 thereafter determines a target drive force distribution ratio $R_T$ by correcting the reference distribution ratio Ro based on the detected lateral acceleration G. In the step P5, a corrective coefficient $\alpha$ is determined based on the lateral acceleration G, and the reference distribution ratio Ro is corrected by being multiplied by the corrective coefficient $\alpha$, or alternatively, a corrective value $\beta$ is determined based on the lateral acceleration G, and the reference distribution ratio Ro is corrected by adding the corrective value $\beta$ to or subtracting the corrective value $\beta$ from the reference distribution ratio Ro.

Figure 8:
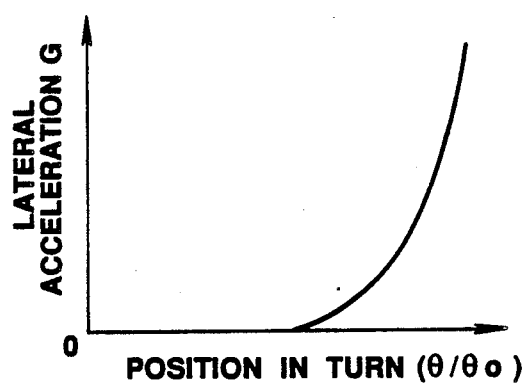
FIG. 8 is a graph showing lateral acceleration characteristics.

The lateral acceleration G varies with the position ($\theta/\theta o$) of the motor vehicle in the turn as shown in FIG. 8. Therefore, the reference distribution ratio Ro is corrected mainly in a final phase of the turn in the step P5. In the above embodiment, the reference distribution ratio Ro is selected to be substantially proportional to the lateral acceleration G in the final phase of the turn. Consequently, in a region where the lateral acceleration G is larger, the corrective coefficient $\alpha$ or the corrective value $\beta$ is large to correct the reference distribution ratio Ro to a large extent.

In the step P5, furthermore, a drive force distribution ratio $R_P$ of the rear road wheels 16RL, 16RR to the front road wheels 16FL, 16FR is also determined from a predetermined data table based on the steering force T and the lateral acceleration G.

In a next step P6, electric currents to be supplied to the solenoids 48a, 48b, 48c of the solenoid-operated control valves 37, 38, 39 are determined based on the target drive force distribution ratio $R_T$ between the rear road wheels and the drive force distribution ratio $R_P$ between the front and rear road wheels. The determined currents are then supplied to the solenoids 48a, 48b, 48c in a step P7. Therefore, torques dependent on the currents supplied to the solenoids 48b, 48c are transmitted through the clutches 34RL, 34RR to the rear road wheels 16RL, 16RR so that the drive force distribution ratio between the rear road wheels 16RL, 16RR is controlled to reach the target distribution ratio $R_T$.

Figure 9:
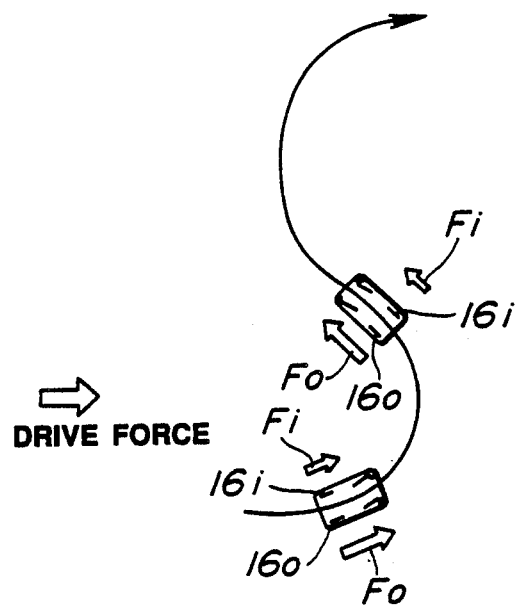
FIG. 9 is a diagram the manner in which the control system operates.

In the manner described above, the reference distribution ratio Ro is determined dependent on the steering force T, and then corrected into the target distribution ratio $R_T$ dependent on the lateral acceleration G. The target distribution ratio $R_T$ is of a value dependent on the steering force proportional to the position of the motor vehicle in its turn during the initial phase of the turn, and is corrected based on the lateral acceleration G into a value corresponding to the position of the motor vehicle in its turn during the final phase of the turn. Therefore, the drive force distribution ratio between the rear road wheels 16RL, 16RR is controlled so as to be of an optimum value dependent on the position in the turn in the entire phase of the turn. For example, as shown in FIG. 9, a drive force Fo applied to a rear road wheel 16o on an outer turning circle can be made larger than a drive force Fi applied to a rear road wheel 16i on an inner turning circle, and the ratio between these drive forces Fo, Fi can be of a value dependent on the turning conditions of the motor vehicle for increased turning performance of the motor vehicle.

Figure 4:
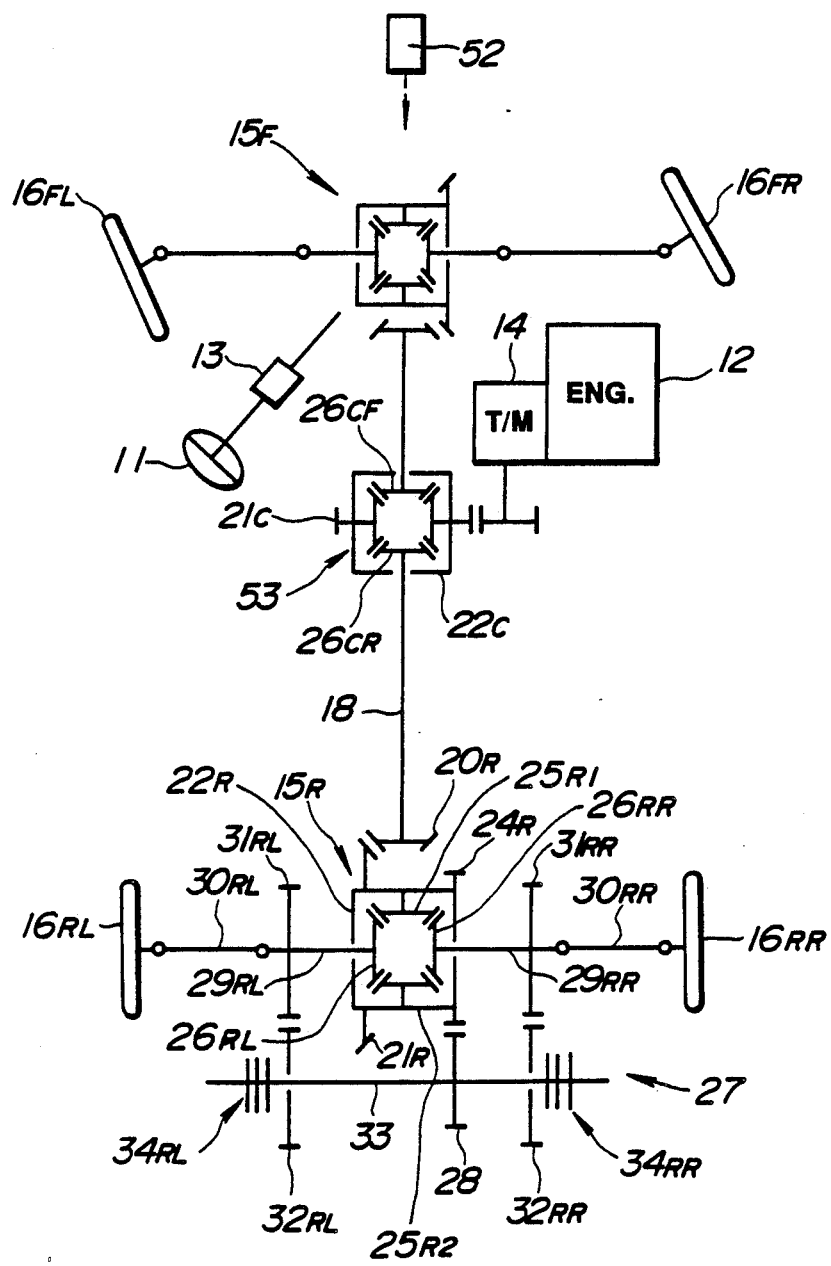
FIGS. 4, 5, and 6 are schematic plan views of power transmission mechanisms of drive force distribution control systems according to second, third, and fourth embodiments of the present invention.
Figure 5:
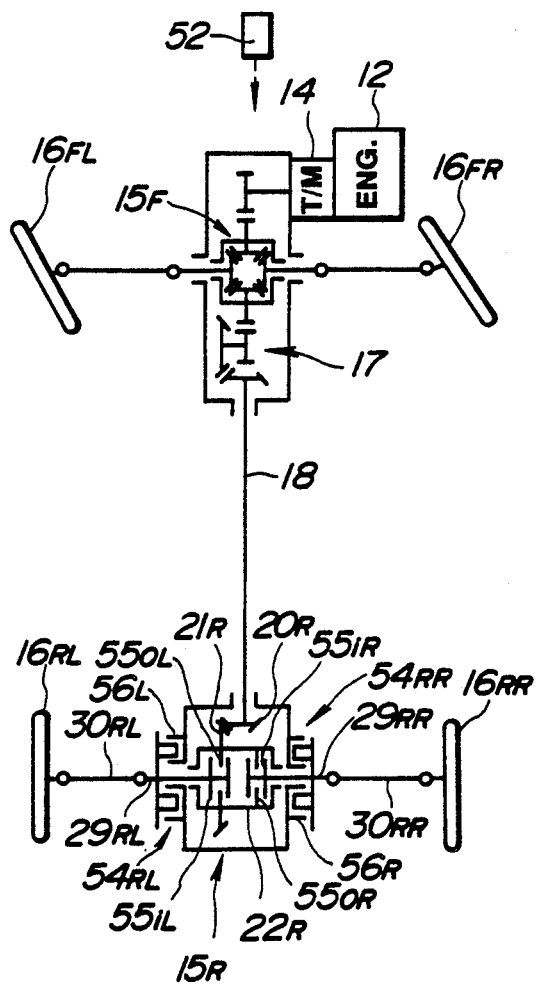
Figure 6:
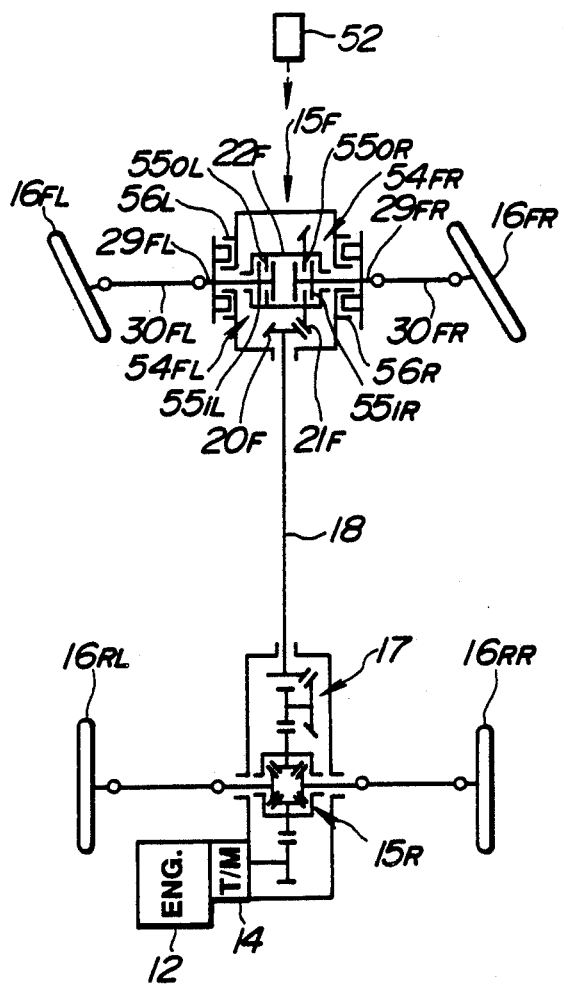

FIGS. 4, 5, and 6 illustrate power transmission mechanisms of drive force distribution control systems according to second, third, and fourth embodiments, respectively, of the present invention. Those parts in FIGS. 4, 5, and 6 which are identical or equivalent to those of the first embodiment are denoted by identical reference numerals, and will not be described in detail.

According to the second embodiment shown in FIG. 4, a mechanical central differential 53 is mounted on the propeller shaft 18 instead of the transfer clutch 19 of the first embodiment. The central differential 53 has a differential case 22c having a driven gear 21c meshing with the drive gear on the output shaft of the transmission 14. The central differential 53 also has a pair of side gears 26CF, 26CR coupled respectively to the front and rear differentials 15F, 15R.

In the second embodiment, the drive force distribution ratio between the rear road wheels 16RL, 16RR is controlled in the same manner as in the first embodiment so as to be dependent on the position of the motor vehicle in its turn for increased turning performance thereof.

According to the third embodiment, as shown in FIG. 5, the rear differential 15R is associated with hydraulically operated multiplate clutches 54RL, 54RR disposed between the differential case 22R and the output shafts 29RL, 29RR. The multiplate clutches 54RL, 54RR comprise friction plates 55oL, 55oR fixed to lateral inner wall surfaces of the case 22R, friction plates 55iL, 55iR fixedly mounted on the output shafts 29RL, 29RR, respectively, and hydraulic chambers 56L, 56R defined on outer lateral wall surfaces of the case 22R. The friction plates 55oL, 55oR and the friction plates 55iL, 55iR are axially alternately arranged. The friction plates 55oL, 55iL and the friction plates 55oR, 55iR are frictionally engageable with each other dependent on the hydraulic pressure introduced into the hydraulic chambers 56L, 56R.

In the third embodiment, oil under pressure is introduced into the hydraulic chambers 56L, 56R of the multiplate clutches 54RL, 54RR to individually adjust torques to be transmitted to the rear road wheels 16RL, 16RR for controlling the distribution of drive forces to the rear road wheels 16RL, 16RR. The other structural details and operation of the third embodiment are the same as those of the first embodiment.

According to the fourth embodiment, as illustrated in FIG. 6, the engine 12 and the transmission 14 are positioned in a rear portion of a motor vehicle. The power from the engine 12 is transmitted through the rear differential 15R and the propeller shaft 18 to the front differential 15F. The front differential 15F has hydraulically operated multiplate clutches 54FL, 54FR capable of varying torques transmitted thereby, as with the third embodiment.

In the fourth embodiment, the drive force distribution ratio between the front road wheels 16FL, 16FR is controlled by the multiplate clutches 54FL, 54FR of the front differential 15F.

In each of the foregoing embodiments, the present invention is applied to a four-wheel-drive motor vehicle. However, the principles of the present invention are also applicable to a motor vehicle in which only two laterally spaced front or rear road wheels are driven. The drive force distribution mechanism in each of the above embodiments has been described briefly for the sake of brevity, but is illustrated in detail in Japanese Patent Applications Nos. 63-3490, 63-7845, and 63-61668 filed by the applicant.

With the present invention, as described above, the drive force distribution ratio between the laterally spaced drive road wheels is controlled so as to be of an optimum value dependent on the position in a turn of the motor vehicle from initial to final phases of the turn, so that the turning performance of the motor vehicle will be increased.

Although there have been described what are at present considered to be the preferred embodiments of the present invention, it will be understood that the invention may be embodied in other specific forms without departing from the essential characteristics thereof. The present embodiments are therefore to be considered in all aspects as illustrative, and not restrictive. The scope of the invention is indicated by the appended claims rather than by the foregoing description.

I claim:

1. A drive force distribution control system for a motor vehicle having a pair of laterally spaced drive road wheels, comprising:
    a drive force distribution mechanism for varying a distribution ratio between drive forces to be applied to each of the laterally spaced drive wheels of said pair of drive road wheels;
    steering force detecting means for detecting the magnitude and direction of a steering force manually applied to steer the motor vehicle;
    lateral acceleration detecting means for detecting a lateral acceleration applied to the motor vehicle;
    distribution ratio determining means for determining a target distribution ratio between drive forces to be applied to each of the laterally spaced drive wheels of said pair of drive road wheels based on the steering force detected by said steering force detecting means and the lateral acceleration detected by said lateral acceleration detecting means; and
    drive means for actuating said drive force distribution mechanism so that the drive force distribution ratio between the drive force to be applied to each of the drive wheels of said pair of laterally spaced drive road wheels will be equalized to said target distribution ratio determined by said distribution ratio determining means.

2. A drive force distribution control system according to claim 1, wherein said distribution ratio determining means comprises means for determining said target distribution ratio such that a drive force to be applied to one of the drive road wheels which is on an outer turning circle when the motor vehicle makes a turn will be greater than a drive force to be applied to the other drive road wheel which is on an inner turning circle.

3. A drive force distribution control system according to claim 1, for a motor vehicle having front and rear drive road wheels, one of said front and rear drive road wheels comprising said pair of drive road wheels, wherein said drive force distribution mechanism includes a further mechanism for varying a drive force distribution ratio of the rear drive road wheels to the front drive road wheels, said distribution ratio determining means including means for determining the drive force distribution ratio of the rear drive wheels to the front drive wheels depending on the steering force and the lateral acceleration, said drive means including means for actuating said drive force distribution mechanism so that the drive force distribution ratio of the rear drive road wheels to the front drive road wheels will be equalized to the distribution ratio determined by said means of the distribution ratio determining means.

4. A drive force distribution control system according to claim 1, wherein said drive force distribution mechanism comprises a hydraulically operated differential having a differential case, output shafts and hydraulic clutch means disposed between said differential case and said output shafts.

5. A drive force distribution control system for a motor vehicle having a pair of laterally spaced drive road wheels, comprising:
    a drive force distribution mechanism for varying a distribution ratio between drive forces to be applied to each of the laterally spaced drive wheels of said pair of drive road wheels;
    steering force detecting means for detecting the magnitude and direction of a steering force manually applied to steer the motor vehicle;
    lateral acceleration detecting means for detecting a lateral acceleration applied to the motor vehicle;
    distribution ratio determining means comprising means for determining a reference distribution ratio based on the steering force and correcting the reference distribution ratio into a target distribution ratio based on the lateral acceleration for determining the target distribution ratio between drive forces to be applied to each of the laterally spaced drive wheels of said pair of drive road wheels based on the steering force detected by said steering force detecting means and the lateral acceleration detected by said lateral acceleration detecting means; and
    drive means for actuating said drive force distribution mechanism so that the drive force distribution ratio between the drive force to be applied to each of the drive wheels of said pair of laterally spaced drive road wheels will be equalized to said target distribution ratio determined by said distribution ratio determining means.

6. A drive force distribution control system according to claim 5, wherein said distribution ratio determining means comprises means for determining a corrective coefficient based on the lateral acceleration and multiplying said reference distribution ratio by said corrective coefficient to correct the reference distribution ratio.

7. A drive force distribution control system according to claim 5, wherein said distribution ratio determining means comprises means for determining a corrective value based on the lateral acceleration and adding said corrective value to or subtracting said corrective value from said reference distribution ratio to correct the reference distribution ratio.

8. A drive force distribution control system according to claim 5, wherein said drive force distribution mechanism comprises a mechanical differential having a differential case and output shafts, and a transmission mechanism having a countershaft disposed parallel to said output shafts and rotationally driven by said differential case, transmission gears for transmitting rotational power of said countershaft to said output shafts and hydraulic clutch means disposed between said countershaft and said transmission gears.

9. A drive force distribution control according to claim 5, wherein said drive force distribution mechanism comprises a mechanical differential case and output shafts, and a transmission mechanism having a countershaft disposed parallel to said output shafts and rotationally driven by said differential case, transmission gears for transmitting rotational power of said countershaft to said output shafts and hydraulic clutch means disposed between said countershaft and said transmission gears.

10. A drive force distribution control system according to claim 5, wherein said drive force distribution mechanism comprises a hydraulically operated differential having a differential case, output shafts and hydraulic clutch means disposed between said differential case and said output shafts.

* * * * *